United States Patent
Lin et al.

(10) Patent No.: US 10,674,617 B2
(45) Date of Patent: Jun. 2, 2020

(54) CARRIER APPARATUS AND DISPLAY

(71) Applicant: E Ink Holdings Inc., Hsinchu (TW)

(72) Inventors: Kuan-Yi Lin, Hsinchu (TW); Yu-Wen Chen, Hsinchu (TW); Yu-Chieh Hung, Hsinchu (TW); Chun-Yu Lu, Hsinchu (TW); Chia-Chun Yeh, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/986,822

(22) Filed: May 23, 2018

(65) Prior Publication Data

US 2018/0343756 A1   Nov. 29, 2018

(30) Foreign Application Priority Data

May 23, 2017   (CN) .......................... 2017 1 0366917

(51) Int. Cl.
*H05K 5/00* (2006.01)
*B32B 7/14* (2006.01)
(Continued)

(52) U.S. Cl.
CPC ............. *H05K 5/0017* (2013.01); *B32B 7/14* (2013.01); *G02F 1/16753* (2019.01);
(Continued)

(58) Field of Classification Search
CPC .... H05K 5/0017; B32B 7/14; B32B 2457/20; G02F 1/167; G02F 2202/28;
(Continued)

(56) References Cited

U.S. PATENT DOCUMENTS 9,348,450 B1 * 5/2016 Kim ...................... G06F 1/1681
2015/0144913 A1   5/2015 Shim
(Continued)

FOREIGN PATENT DOCUMENTS

| CN | 105379420 | 3/2016 |
| CN | 205451694 | 8/2016 |
| CN | 205943347 | 2/2017 |

OTHER PUBLICATIONS

"Office Action of China Counterpart Application," dated Nov. 21, 2019, p. 1-p. 7.

*Primary Examiner* — Rockshana D Chowdhury
(74) *Attorney, Agent, or Firm* — JCIPRNET

(57) ABSTRACT

A carrier apparatus is adapted to carry a flexible substrate. The carrier apparatus includes two carrier plates, two adhesive layers, and two supporting units. The carrier plates have a gap with respect to each other, and each of the carrier plates has a first region and a second region, wherein the second regions of the carrier plates are adjacent to each other and are located between the first regions. The adhesive layers are respectively disposed in the first regions of the carrier plates. The supporting units are respectively disposed in the second regions of the carrier plates and are coplanar with the adhesive layers, wherein the flexible substrate is fixed on the carrier plates through the adhesive layers, and the supporting units are detachably attached to a bending zone of the flexible substrate by attractive force. A display including the carrier apparatus and a flexible display panel is provided.

9 Claims, 6 Drawing Sheets

(51) Int. Cl.
 *G02F 1/16753* (2019.01)
 *H01L 51/52* (2006.01)
 *G02F 1/1333* (2006.01)
 *G02F 1/167* (2019.01)
 *G02F 1/16755* (2019.01)

(52) U.S. Cl.
 CPC .... *B32B 2457/20* (2013.01); *G02F 1/133305* (2013.01); *G02F 1/133308* (2013.01); *G02F 1/167* (2013.01); *G02F 1/16755* (2019.01); *G02F 2001/133314* (2013.01); *G02F 2202/28* (2013.01); *H01L 51/5237* (2013.01); *H01L 2251/5338* (2013.01)

(58) Field of Classification Search
 CPC ... G02F 2001/133314; G02F 1/133305; G02F 1/133308; H01L 2251/5338; H01L 51/5237
 USPC .......................................................... 361/809
 See application file for complete search history.

(56) References Cited

U.S. PATENT DOCUMENTS

| | | |
|---|---|---|
| 2015/0266610 A1 | 9/2015 | Melmon et al. |
| 2015/0378391 A1 | 12/2015 | Huitema et al. |
| 2016/0209874 A1 | 7/2016 | Choi et al. |
| 2016/0323006 A1 | 11/2016 | Sartee et al. |
| 2016/0323966 A1* | 11/2016 | Hamel ................... H05B 33/26 |
| 2017/0118853 A1 | 4/2017 | Lee et al. |
| 2018/0107250 A1* | 4/2018 | Cho ........................ G09F 9/301 |

\* cited by examiner

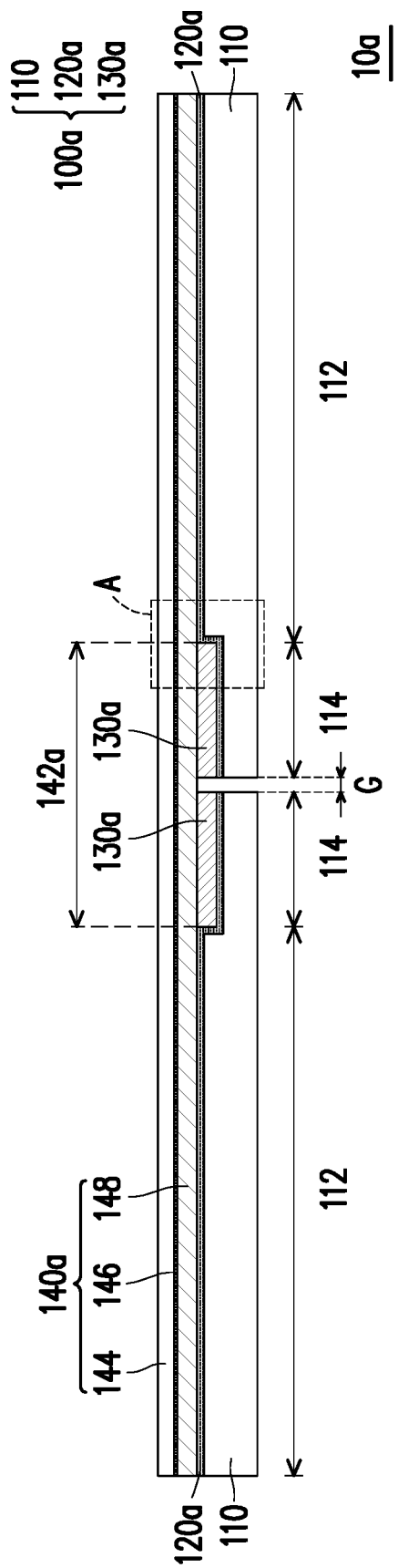
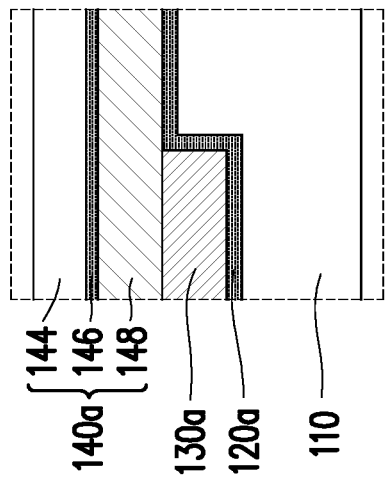
FIG. 1A
FIG. 1B

CARRIER APPARATUS AND DISPLAY

CROSS-REFERENCE TO RELATED APPLICATION

This application claims the priority benefit of China application serial no. 201710366917.7, filed on May 23, 2017. The entirety of the above-mentioned patent application is hereby incorporated by reference herein and made a part of this specification.

BACKGROUND OF THE INVENTION

Field of the Invention

The invention relates to a carrier apparatus and a display, and in particular, a carrier apparatus adapted to carry a flexible substrate and a display using the carrier apparatus.

Description of Related Art

As the display technology advances, displays have been developed to be thin, flat, and small, and meanwhile their weight and space occupied are decreased. In recent years, the flexible display has been developing rapidly. Since the flexible display can be folded to occupy less space, it is easy to carry around. Moreover, when the flexible display is used, it can be spread from a folded state to a planar state, so that it creates a display image having a large area, which diversifies applications of the display.

However, in a conventional flexible display, when the flexible display is spread for use, a bending zone of its panel usually shows warpage and is not evenly attached on carrier plates. In other words, when the flexible display is not bent, there is an issue that the bending zone of its panel is not fixed and cannot be completely evenly attached on the carrier plates, which thereby causes uneven image brightness and lowers impact resistance of the flexible display.

SUMMARY OF THE INVENTION

The invention provides a carrier apparatus that enables a flexible substrate to completely evenly attach on carrier plates when the flexible substrate is not bent.

The invention provides a display that includes the above-described carrier apparatus and exhibits advantages such as uniformization of image brightness and impact resistance.

A carrier apparatus of the invention is adapted to carry a flexible substrate. The carrier apparatus includes two carrier plates, two adhesive layers, and two supporting units. The carrier plates have a gap with respect to each other, and each of the carrier plates has a first region and a second region, wherein the second regions of the carrier plates are adjacent to each other and are located between the first regions. The adhesive layers are respectively disposed in the first regions of the carrier plates. The supporting units are respectively disposed in the second regions of the carrier plates and are coplanar with the adhesive layers, wherein the flexible substrate is fixed on the carrier plates through the adhesive layers, and the supporting units are detachably attached to a bending zone of the flexible substrate by attractive force.

In an embodiment of the invention, when the flexible substrate is not bent, the supporting units are attached on the flexible substrate by attractive force, such that the bending zone of the flexible substrate is evenly attached on the supporting units. When the flexible substrate is bent, the supporting units are separated from the flexible substrate and expose the bending zone.

In an embodiment of the invention, the supporting units are detachably attached to the bending zone of the flexible substrate by magnetic force, electrostatic force, or sucker force.

In an embodiment of the invention, the supporting unit is an electrostatic patch or a nanosucker.

In an embodiment of the invention, the supporting unit is a magnetic component, and the flexible substrate includes a substrate body, a gel layer, and a magnetic component layer. The gel layer is located between the substrate body and the magnetic component layer. The magnetic component layer of the flexible substrate and the supporting units have a magnetic force between each other to force the bending zone of the flexible substrate to evenly attach on the supporting units.

The invention additionally provides a display including a carrier apparatus and a flexible display panel. The carrier apparatus includes two carrier plates and two supporting units. The carrier plates have a gap with respect to each other, and each of the carrier plates has a first region and a second region, wherein the second regions of the carrier plates are adjacent to each other and are located between the first regions. The supporting units are respectively disposed in the second regions of the carrier plates. The flexible display panel is disposed on the carrier plates of the carrier apparatus. The supporting units are detachably attached to a bending zone of the flexible display panel by attractive force.

In an embodiment of the invention, when the flexible display panel is not bent, the supporting units are attached on the flexible display panel by attractive force, such that the bending zone of the flexible display panel is evenly attached on the supporting units. When the flexible display panel is bent, the supporting units are separated from the flexible display panel and expose the bending zone.

In an embodiment of the invention, the supporting units are detachably attached to the bending zone of the flexible display panel by magnetic force, electrostatic force, or sucker force.

In an embodiment of the invention, the supporting unit is an electrostatic patch or a nanosucker.

In an embodiment of the invention, the supporting unit is a magnetic component, and the flexible display panel includes a panel body, a gel layer, and a magnetic component layer. The gel layer is located between the panel body and the magnetic component layer. The magnetic component layer of the flexible display panel and the supporting units have a magnetic force between each other to force the bending zone of the flexible display panel to evenly attach on the supporting units.

In an embodiment of the invention, the display further includes two adhesive layers respectively disposed in the first regions of the carrier plates. The supporting units are coplanar with the adhesive layers, and the flexible display panel is fixed on the carrier plates through the adhesive layers.

In an embodiment of the invention, the carrier plates are magnetic, and the carrier plates and the flexible display panel are attached to each other by a magnetic force.

In light of the above, in the design of the carrier apparatus of the invention, the adhesive layers are respectively disposed in the first regions of the carrier plates, and the supporting units are respectively disposed in the second regions of the carrier plates and are coplanar with the adhesive layers. Accordingly, the flexible substrate is fixed on the carrier plates through the adhesive layers, and the supporting units are detachably attached to the bending zone of the flexible substrate by attractive force. Through this design, the flexible substrate disposed on the carrier apparatus of the invention can be completely evenly attached on the carrier plates when the flexible substrate is not bent.

To provide a further understanding of the aforementioned and other features and advantages of the invention, exemplary embodiments, together with the reference drawings, are described in detail below.

BRIEF DESCRIPTION OF THE DRAWINGS

FIG. 1A is a cross-sectional schematic diagram illustrating a display according to an embodiment of the invention.

FIG. 1B is a schematic diagram illustrating a partially enlarged area A of the display of FIG. 1A.

DESCRIPTION OF THE EMBODIMENTS

Figure 2:
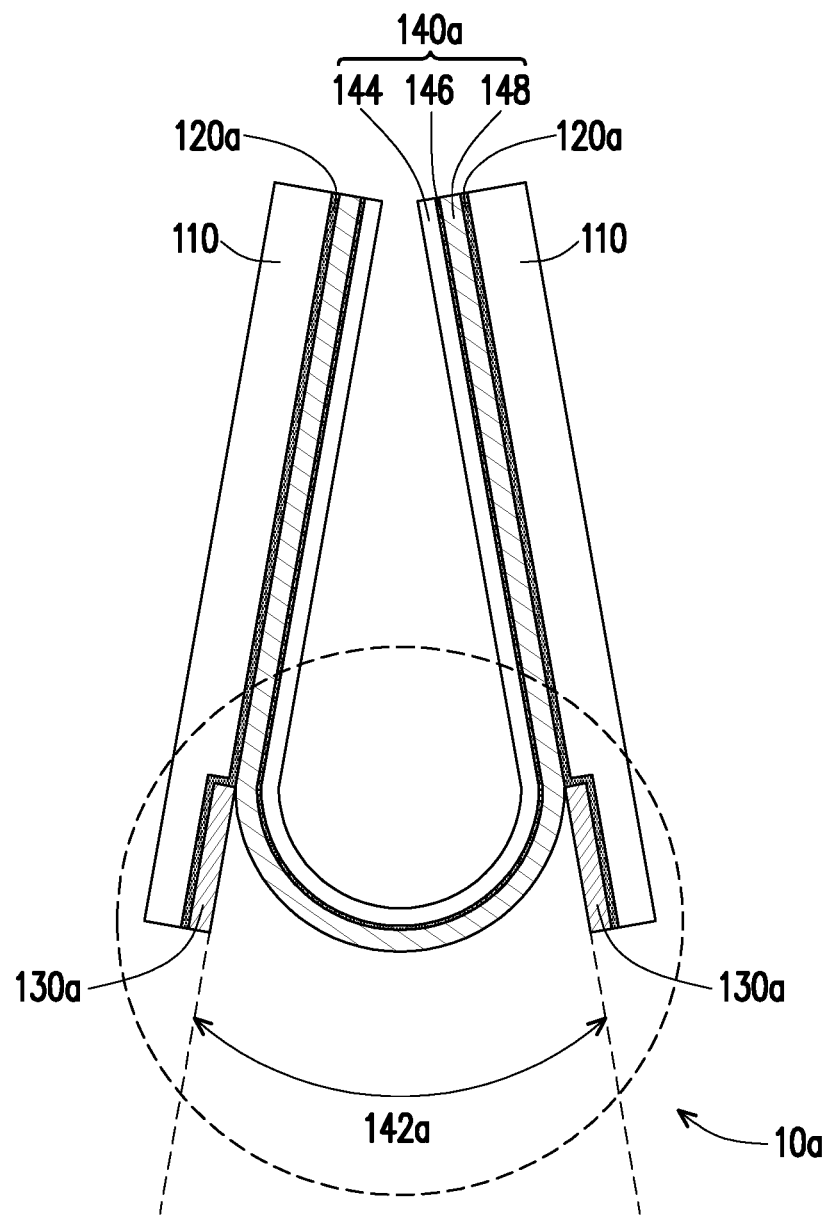
FIG. 2 is a cross-sectional schematic diagram illustrating the display of FIG. 1A when the display is bent.

FIG. 1A is a cross-sectional schematic diagram illustrating a display according to an embodiment of the invention. FIG. 1B is a schematic diagram illustrating a partially enlarged area A of the display of FIG. 1A. FIG. 2 is a cross-sectional schematic diagram illustrating the display of FIG. 1A when the display is bent.

Referring to both FIG. 1A and FIG. 1B first, in the present embodiment, a display 10a includes a carrier apparatus 100a and a flexible display panel 140a. The carrier apparatus 100a includes two carrier plates 110, two adhesive layers 120a, and two supporting units 130a. The carrier plates 110 have a gap G with respect to each other, and each of the carrier plates 110 has a first region 112 and a second region 114, wherein the second regions 114 of the carrier plates 110 are adjacent to each other and are located between the first regions 112. The adhesive layers 120a are respectively disposed in the first regions 112 of the carrier plates 110. The supporting units 130a are respectively disposed in the second regions 114 of the carrier plates 110 and are coplanar with the adhesive layers 120a. The flexible display panel 140a is disposed on the carrier plates 110 of the carrier apparatus 100a and is fixed on the carrier plates 110 through the adhesive layers 120a. The supporting units 130a are detachably attached to a bending zone 142a of the flexible display panel 140a by attractive force.

Specifically, the carrier apparatus 100a of the present embodiment is adapted to carry a flexible substrate, which is, for example, the flexible display panel 140a but is not limited hereto. The carrier plates 110 of the carrier apparatus 100a have the gap G with respect to each other, wherein the carrier plates 110 are used as supporting components to support the flexible display panel 140a. Particularly, the supporting unit 130a of the present embodiment is specifically a magnetic component. In an embodiment, the adhesive layers 120a are disposed in the first regions 112 and the second regions 114 of the carrier plates 110. In other words, the adhesive layers 120a are extended to be disposed between the supporting units 130a and the carrier plates 110, and the supporting units 130a are fixed on the carrier plates 110 through the adhesive layers 120a. On the other hand, the flexible display panel 140a specifically includes a panel body 144 (which can be seen as a substrate body), a gel layer 146, and a magnetic component layer 148, wherein the gel layer 146 is located between the panel body 144 and the magnetic component layer 148. The magnetic component layer 148 of the flexible display panel 140a and the supporting units 130a have a magnetic force between each other to force the bending zone 142a of the flexible display panel 140a to evenly attach on the supporting units 130a. Here, the flexible display panel 140a is, for example, an electrophoretic display panel or an OLED panel but is not limited hereto.

More specifically, referring to FIG. 1A and FIG. 1B again, the supporting units 130a of the present embodiment are detachably attached to the bending zone 142a of the flexible display panel 140a by magnetic force. In other words, when the flexible display panel 140a is not bent, the supporting units 130a are attached on the flexible display panel 140a by magnetic force, such that the bending zone 142a of the flexible display panel 140a is completely evenly attached on the supporting units 130a. Accordingly, issues of uneven image brightness and lowered impact resistance of a display resulting from warpage in the bending zone of the panel in the conventional art can be avoided. Next, as shown in FIG. 2, when the flexible display panel 140a is bent, the supporting units 130a are separated from the flexible display panel 140a and expose the bending zone 142a. In other words, when the flexible display panel 140a is subjected to an external force greater than the magnetic force, the flexible display panel 140a is bent and is separated from the supporting units 130a.

In brief, in the design of the carrier apparatus 100a of the present embodiment, the adhesive layers 120a are respectively disposed in the first regions 112 of the carrier plates 110, and the supporting units 130a are respectively disposed in the second regions 114 of the carrier plates 110 and are coplanar with the adhesive layers 120a. Accordingly, the flexible substrate (e.g., the flexible display panel 140a) is fixed on the carrier plates 110 through the adhesive layers 120a, and the supporting units 130a are detachably attached to the bending zone of the flexible substrate (e.g., the bending zone 142a of the flexible display panel 140a) by attractive force (e.g., magnetic force). Therefore, when the flexible substrate is not bent, the flexible substrate is completely evenly attached on the supporting units 130a. Through this design, the display 10a of the present embodiment enables the flexible display panel 140a to completely evenly attach on the carrier plates 110 of the carrier apparatus 100a when the flexible display panel 140a is not bent and thereby exhibit advantages such as uniformization of image brightness and impact resistance.

It shall be noted here that the reference numerals and part of the content of the foregoing embodiment apply to the following embodiments, wherein the same reference numerals are used to indicate the same or similar components, and descriptions of the same technical content are omitted.

Reference may be made to the foregoing embodiment for the omitted descriptions, which shall not be repeated in the following embodiments.

Figure 3A:
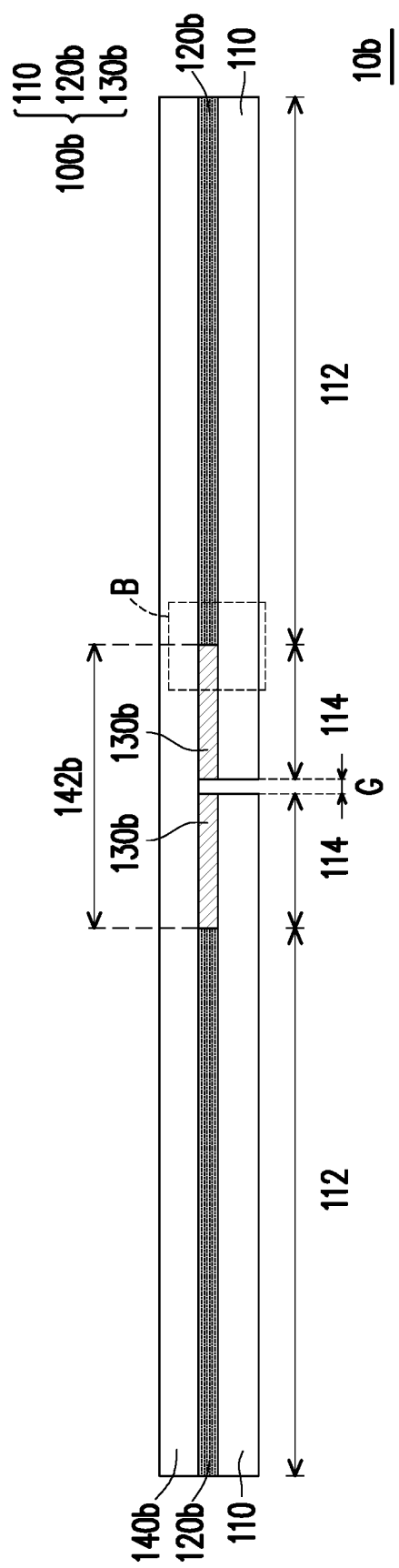
FIG. 3A is a cross-sectional schematic diagram illustrating a display according to another embodiment of the invention.
Figure 3B:
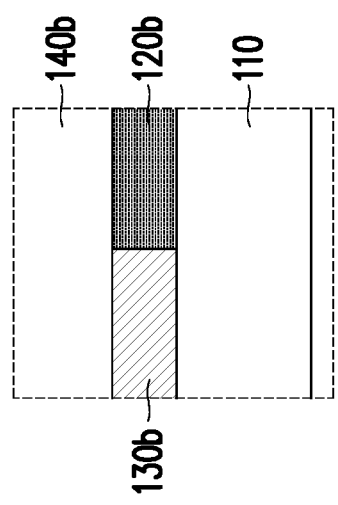
FIG. 3B is a schematic diagram illustrating a partially enlarged area B of the display of FIG. 3A.
Figure 4:
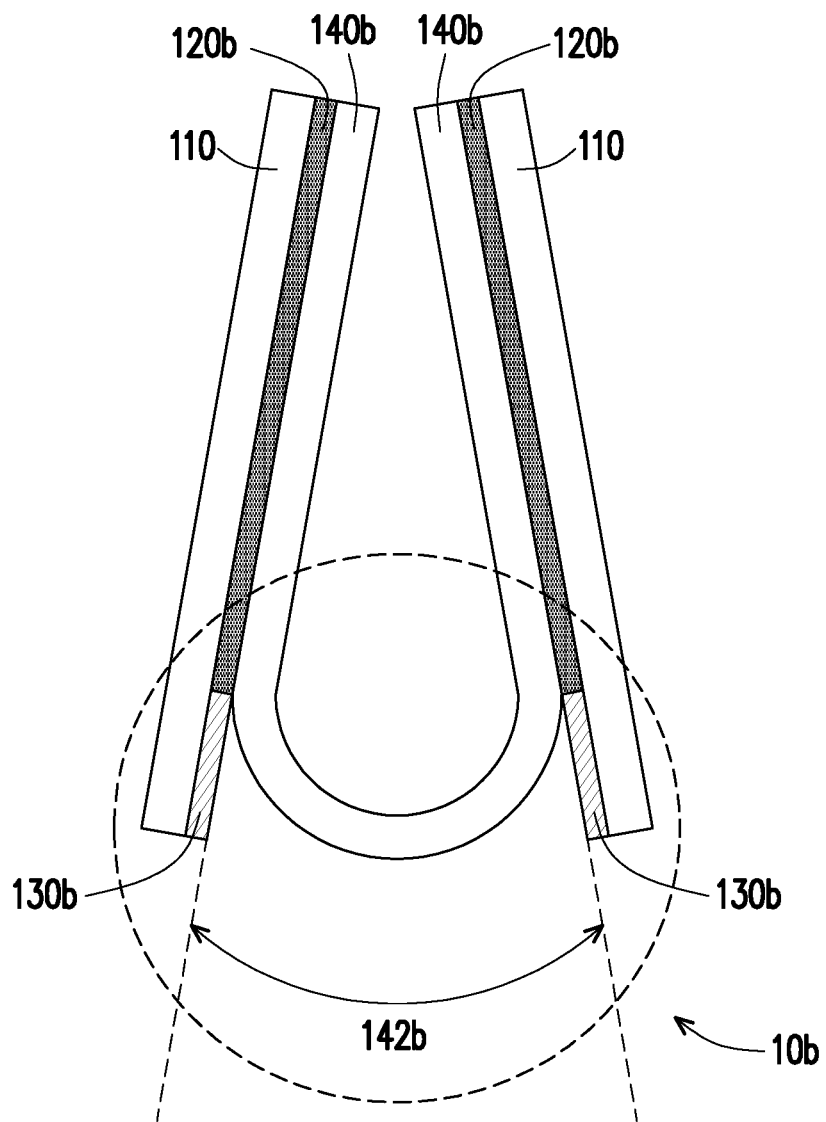
FIG. 4 is a cross-sectional schematic diagram illustrating the display of FIG. 3A when the display is bent.

FIG. 3A is a cross-sectional schematic diagram illustrating a display according to another embodiment of the invention. FIG. 3B is a schematic diagram illustrating a partially enlarged area B of the display of FIG. 3A. FIG. 4 is a cross-sectional schematic diagram illustrating the display of FIG. 3A when the display is bent.

Referring to both FIG. 3A and FIG. 3B first, a display 10b of the present embodiment is similar to the display 10a of FIG. 1A. The main difference between the two lies in that supporting units 130b of the present embodiment are detachably attached to a bending zone 142b of a flexible display panel 140b by electrostatic force or sucker force. Specifically, the supporting unit 130b of the present embodiment is, for example, an electrostatic patch or a nanosucker but is not limited hereto. More specifically, referring to FIG. 3A and FIG. 3B again, two adhesive layers 120b are respectively disposed in the first regions 112 of the carrier plates 110 of the present embodiment, and the supporting units 130b are detachably attached to the bending zone 142b of the flexible display panel 140b by electrostatic force or sucker force. In other words, when the flexible display panel 140b is not bent, the supporting units 130b are attached on the flexible display panel 140b by electrostatic force or sucker force, such that the bending zone 142b of the flexible display panel 140b is completely evenly attached on the supporting units 130b. Accordingly, issues of uneven image brightness and lowered impact resistance of a display resulting from warpage in the bending zone of the panel in the conventional art can be avoided. Next, as shown in FIG. 4, when the flexible display panel 140b is bent, the supporting units 130b are separated from the flexible display panel 140b and expose the bending zone 142b. In other words, when the flexible display panel 140b is subjected to an external force greater than the electrostatic force or the sucker force, the flexible display panel 140b is bent and is separated from the supporting units 130b.

Figure 5A:
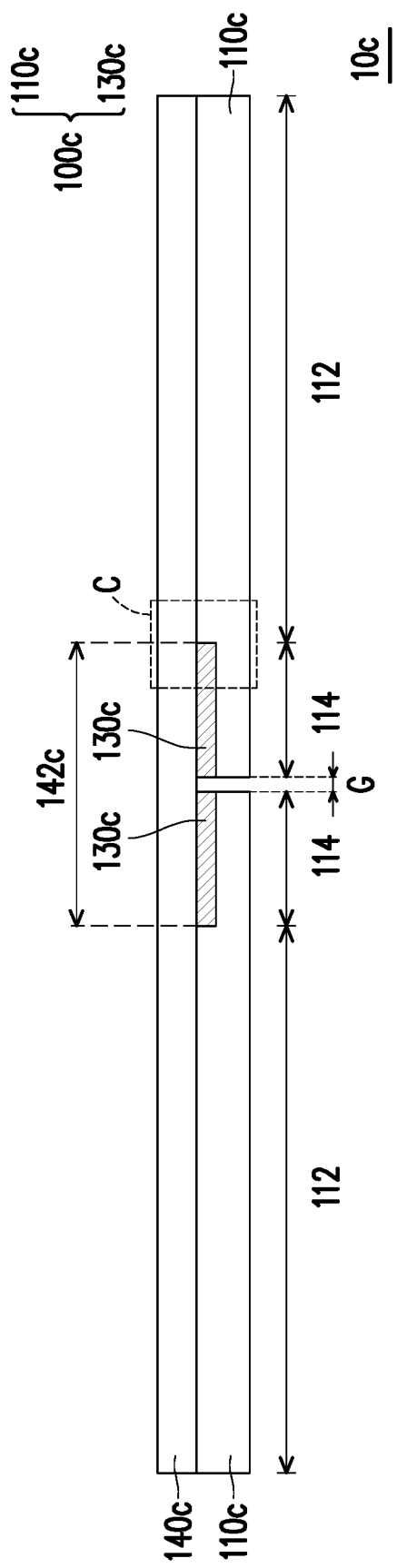
FIG. 5A is a cross-sectional schematic diagram illustrating a display according to another embodiment of the invention.
Figure 5B:
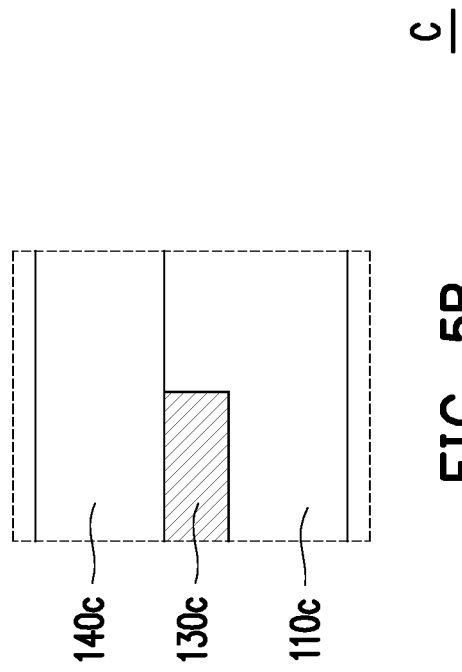
FIG. 5B is a schematic diagram illustrating a partially enlarged area C of the display of FIG. 5A.
Figure 6:
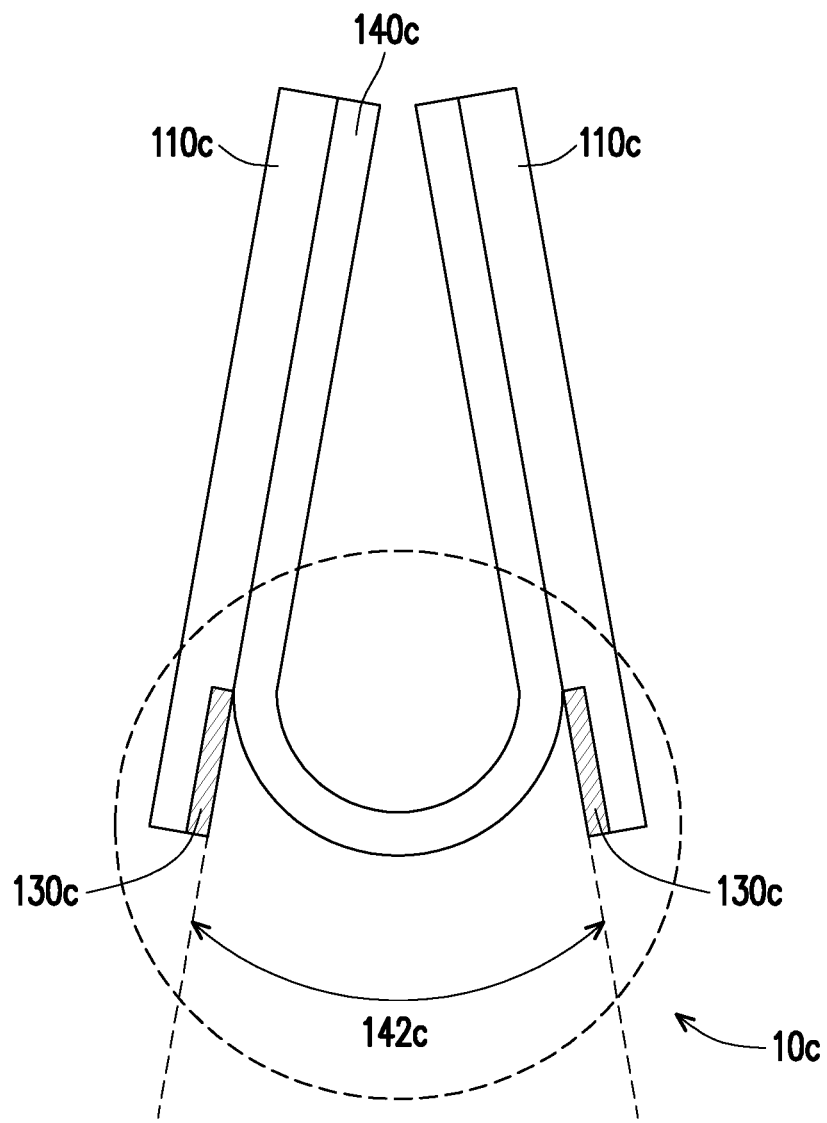
FIG. 6 is a cross-sectional schematic diagram illustrating the display of FIG. 5A when the display is bent.

FIG. 5A is a cross-sectional schematic diagram illustrating a display according to another embodiment of the invention. FIG. 5B is a schematic diagram illustrating a partially enlarged area C of the display of FIG. 5A. FIG. 6 is a cross-sectional schematic diagram illustrating the display of FIG. 5A when the display is bent.

Referring to both FIG. 5A and FIG. 5B first, a display 10c of the present embodiment is similarly to the display 10a of FIG. 1A. The main difference between the two lies in that carrier plates 110c of the present embodiment are magnetic, such that supporting units 130c and a flexible display panel 140c are attached on the carrier plates 110c by a magnetic force. Specifically, referring to FIG. 5A and FIG. 5B again, the supporting units 130c of the present embodiment are detachably attached to a bending zone 142c of the flexible display panel 140c by magnetic force. In other words, when the flexible display panel 140c is not bent, the supporting units 130c are attached on the flexible display panel 140c by magnetic force, such that the bending zone 142c of the flexible display panel 140c is completely evenly attached on the supporting units 130c. Accordingly, issues of uneven image brightness and lowered impact resistance of a display resulting from warpage in the bending zone of the panel in the conventional art can be avoided. Next, as shown in FIG. 6, when the flexible display panel 140c is bent, the supporting units 130c are separated from the flexible display panel 140c and expose the bending zone 142c. In other words, when the flexible display panel 140c is subjected to an external force greater than the magnetic force, the flexible display panel 140c is bent and is separated from the supporting units 130c. It shall be noted that the external force at the time when the flexible display panel 140c is bent is still far less than the magnetic force between the carrier plates 110c and the supporting units 130c and between the carrier plates 110c and the flexible display panel 140c. Accordingly, as shown in FIG. 6, when the flexible display panel 140c is bent, the supporting units 130c and the flexible display panel 140c are still fixed on the carrier plates 110c.

In addition to the methods of magnetic force, electrostatic force, or sucker force through which the supporting units 130a, 130b, and 130c are detachably attached to the bending zones 142a, 142b, and 142c of the flexible display panels 140a, 140b, and 140c as mentioned in the foregoing embodiments, in other unillustrated embodiments, people skilled in the art can achieve the purpose of attractive force or adhesion through methods different from the methods above according to the actual needs, which shall still fall within the scope to be protected by the invention.

In summary of the above, in the design of the carrier apparatus of the invention, the adhesive layers are respectively disposed in the first regions of the carrier plates, and the supporting units are respectively disposed in the second regions of the carrier plates and are coplanar with the adhesive layers. Accordingly, the flexible substrate (e.g., the flexible display panel) can be fixed on the carrier plates through the adhesive layers. Alternatively, the flexible substrate is attached on the carrier plates by the magnetic force, and the supporting units are detachably attached to the bending zone of the flexible substrate by attractive force. Through this design, the flexible substrate disposed on the carrier apparatus of the invention can be completely evenly attached on the carrier plates when the flexible substrate is not bent. Accordingly, due to the inclusion of the carrier apparatus, the display of the invention enables the flexible display panel to completely evenly attach on the carrier plates of the carrier apparatus when the flexible display panel is not bent and thereby exhibit advantages such as uniformization of image brightness and impact resistance.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A carrier apparatus adapted to carry a flexible substrate, the carrier apparatus comprising:
    two carrier plates having a gap with respect to each other, each of the two carrier plates having a first region and a second region, wherein second regions of the two carrier plates are adjacent to each other and are located between first regions;
    two adhesive layers respectively disposed in the first regions of the two carrier plates; and
    two supporting units respectively disposed in the second regions of the two carrier plates and a surface of each of the supporting units facing the flexible substrate is coplanar with a surface of each of the two adhesive layers facing the flexible substrate, wherein the flexible substrate is fixed on the two carrier plates through the two adhesive layers, and the supporting units are detachably attached to a bending zone of the flexible substrate by attractive force,
    wherein when the flexible substrate is not bent, the supporting units are attached on the flexible substrate by attractive force, such that the bending zone of the flexible substrate is evenly attached on the supporting units, and when the flexible substrate is bent, the supporting units are separated from the flexible substrate and expose the bending zone.

2. The carrier apparatus as recited in claim 1, wherein the supporting units are detachably attached to the bending zone of the flexible substrate by magnetic force, electrostatic force, or sucker force.

3. The carrier apparatus as recited in claim 2, wherein each of the supporting units is an electrostatic patch or a nanosucker.

4. The carrier apparatus as recited in claim 2, wherein each of the supporting units is a magnetic component, and the flexible substrate comprises a substrate body, a gel layer, and a magnetic component layer, wherein the gel layer s located between the substrate body and the magnetic component layer, and the magnetic component layer of the flexible substrate and the supporting units have a magnetic force between each other to force the bending zone of the flexible substrate to evenly attach on the supporting units.

5. A display comprising:
  a carrier apparatus comprising:
    two carrier plates having a gap with respect to each other, each of the two carrier plates having a first region and a second region, wherein second regions of the two carrier plates are adjacent to each other and are located between first regions;
    two supporting units respectively disposed in the second regions of the two carrier plates; and
    two adhesive layers respectively disposed in the first regions of the two carrier plates; and
  a flexible display panel disposed on the two carrier plates of the carrier apparatus, wherein the supporting units are detachably attached to a bending zone of the flexible display panel by attractive force, wherein a surface of each of the supporting units facing the flexible display panel is coplanar with a surface of each of the two adhesive layers facing the flexible display panel, and the flexible display panel is fixed on the two carrier plates through the two adhesive layers,
  wherein when the flexible display panel is not bent, the supporting units are attached on the flexible display panel by attractive force, such that the bending zone of the flexible display panel is evenly attached on the supporting units, and when the flexible display panel is bent, the supporting units are separated from the flexible display panel and expose the bending zone.

6. The display as recited in claim 5, wherein the supporting units are detachably attached to the bending zone of the flexible display panel by magnetic force, electrostatic force, or sucker force.

7. The display as recited in claim 6, wherein each of the supporting units is an electrostatic patch or a nanosucker.

8. The display as recited in claim 6, wherein each of the supporting units is a magnetic component, and the flexible display panel comprises a panel body, a gel layer, and a magnetic component layer, wherein the gel layer is located between the panel body and the magnetic component layer, and the magnetic component layer of the flexible display panel and the supporting units have a magnetic force between each other to force the bending zone of the flexible display panel to evenly attach on the supporting units.

9. The display as recited in claim 5, wherein the two carrier plates are magnetic, and the two carrier plates and the flexible display panel are attached to each other by a magnetic force.

* * * * *